United States Patent [19]

Nagamatsu et al.

[11] Patent Number: 5,680,127
[45] Date of Patent: Oct. 21, 1997

[54] PARALLEL-TO-SERIAL CONVERSION DEVICE AND LINEAR TRANSFORMATION DEVICE MAKING USE THEREOF

[75] Inventors: Tetsu Nagamatsu, Kawasaki, Japan; Masataka Matsui, Menlo Park, Calif.

[73] Assignee: Kabushiki Kaisha Toshiba, Tokyo, Japan

[21] Appl. No.: 385,625

[22] Filed: Feb. 9, 1995

[30] Foreign Application Priority Data

Feb. 9, 1994 [JP] Japan .................... 6-015218

[51] Int. Cl.⁶ ................................ H03M 9/00
[52] U.S. Cl. ........................ 341/101; 365/238
[58] Field of Search ..................... 341/100, 101

[56] References Cited

U.S. PATENT DOCUMENTS

| | | | |
|---|---|---|---|
| 4,080,599 | 3/1978 | Conti | 343/5 DP |
| 4,791,598 | 12/1988 | Liou et al. | 364/725 |
| 5,111,436 | 5/1992 | Subotic et al. | 365/238 |
| 5,243,349 | 9/1993 | Mims | 342/25 |
| 5,463,630 | 10/1995 | Tooher | 370/112 |

OTHER PUBLICATIONS

Paul Chow, et al, "A pipelined Distributed Arithmetic PFFT Processor", IEEE Transactions on Computers. vol. C–32. No. 12, Dec. 1983, pp. 1128–1136.

Masataka Matsui, et al.,"200MHz Video Compression Macrocells Using Low–Swing Differential Logic", IEEE International Solid State Circuits Conference.

*Primary Examiner*—Marc S. Hoff
*Attorney, Agent, or Firm*—Loeb & Loeb LLP

[57] ABSTRACT

A parallel-to-serial conversion device capable of improved space efficiency has a corner turn memory array provided in an input section of the device to perform parallel-to-serial conversion by writing in the row direction of the input section and by reading out in the column direction of the input section, write section for selectively writing data into a first pair of memory cells of said corner turn memory array; and readout section for simultaneously reading data from a second pair of memory cells which are different from the first pair of memory cells.

13 Claims, 3 Drawing Sheets

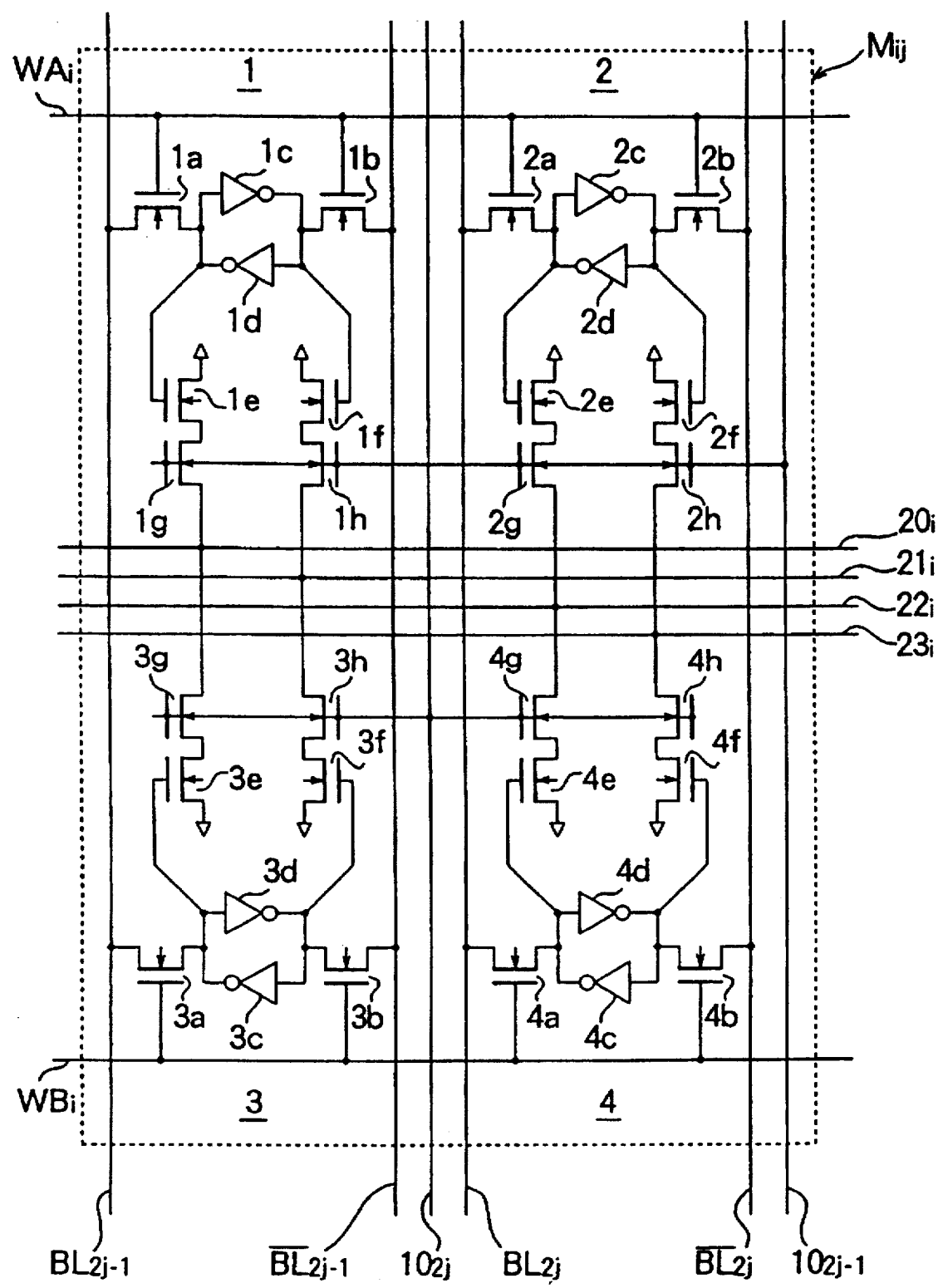
F I G. 1

PARALLEL-TO-SERIAL CONVERSION DEVICE AND LINEAR TRANSFORMATION DEVICE MAKING USE THEREOF

BACKGROUND OF THE INVENTION

1. Field of the Invention

The present invention relates to a parallel-to-serial conversion device, and more specifically to a parallel-to-serial conversion device which is used as a data input device of a linear transformation device.

2. Description of the Background Art

A typical linear transformation device used for the compression and decompression of image data is a orthogonal transformation device, such as a device which performs, for example, a discrete cosine transformation or a discrete Fourier transformation. In a discrete cosine transformation or discrete Fourier transformation processor, use is made of a multiply and accumulation. This multiply and accumulation is often performed by a distributed arithmetic, consisting of first storing each digit multiplication result in a ROM (Read Only Memory), and then performing an accumulation calculation. In general, a parallel-to-serial conversion device is used as a linear transformation device which makes use of distributed arithmetic is used in the data input device of such devices. To minimize the amount of space occupied by the data input device, a corner turn memory is used as the parallel-to-serial conversion device.

For example, examples of the use of a corner turn memory in a data input device include the co-pending Japanese patent application 5-267376 (1993), which relates to a discrete cosine transform processor, and the paper by Paul Chow, et al, "A Pipelined Distributed Arithmetic PFFT Processor," which is an example related to a discrete Fourier transformation device disclosed in the IEEE Transactions on Computers, Vol. C-32, No. 12, December, 1983.

FIG. 3 shows a prior art data input device of a linear transformation device such as a discrete cosine transformation device, which uses distributed arithmetic. The configuration of this data input device from the prior art has two banks of corner turn memory, 70 and 80, which perform parallel-to-serial conversion. Each corner turn memory has eight words, WORD0 to WORD7, in each of which is stored, for example, 16 bits of input data. In general, writing into the corner turn memory is done in the word direction, and reading from the corner turn memory is done in the bit direction, enabling the memory to perform parallel-to-serial conversion. In the prior art data input device shown in FIG. 3, first eight input data is written into the A bank, which is the corner turn memory 70, and during the readout of that written data, the next eight input data are written into the B bank, which is the corner turn memory 80. Then, during the readout of the data which was written in the B bank, input data is written into the A bank, the corner turn memory 70. Therefore, it is possible to perform continuous input of data. Furthermore, when reading out data, two bits of data are read out for each cycle in the data input device shown in FIG. 3. The data readout is performed starting from the lower order bit. If each of in input data is 16 bits, it requires eight cycles to complete the reading of input data.

In this manner, in a data input device (parallel-to-serial conversion device) of the prior art, two corner turn memories are used, so that the amount of space occupied by the data input device was still considerable. Furthermore, a data input device for a discrete Fourier transformation processor, as disclosed in the paper by Paul Chow, et al, is formed by one corner turn memory and two banks of RAM (random access memory), making the space required for this data input device quite large, as is the case for the discrete cosine transform processor.

SUMMARY OF THE INVENTION

With these conditions in mind, the object of the present invention is to provide a parallel-to-serial conversion device, a discrete cosine transformation device, and a discrete Fourier transformation device capable of enabling the smallest possible occupied space.

According one aspect of the present invention, there is provided a parallel-to-serial conversion device comprising:

a corner turn memory array provided in an input section of the device, having a plurality of memory cells arranged in matrix form, said corner turn memory performing parallel-to-serial conversion by writing in row direction of the input section and by reading out in the column direction of the input section;

write means for selectively writing data into a first pair of memory cells of said corner turn memory array; and readout means for simultaneously reading data from a second pair of memory cells which are different from the first pair of memory cells.

According to another aspect of the present invention, there is provided a parallel-to-serial conversion device comprising:

a memory section having a plurality of memory cell blocks having a same number of memory cell pairs comprised of a first memory cell and a second memory cell whose output terminal is commonly connected to an output terminal of the first memory cell;

a data input bit line provided for each memory cell pair within a memory cell block column, for the purpose of inputting data to said memory cell pairs;

first and second writing word lines provided for each memory cell block row, for the purpose of selecting the memory cells when writing data into the first and second memory cells of a memory block row;

first and second readout word lines provided for each memory cell block column, for the purpose of reading out data from the first and second memory cells of a the memory cell block column;

a data readout bit line provided for each memory cell pair in a memory cell block row;

first word line selection means for selecting one word line from said plurality of writing word lines based on a decode signal when writing data; and second word line selection means for selecting one word line from said plurality of reading word lines based on a decode signal when reading data.

In a parallel-to-serial conversion device according to the present invention, when first writing data, in addition to inputting data to the data input bit lines, one write word line is selected by means of a decode signal in accordance with a first word line selection means. Then data is written into the first or second memory cells within the one memory cell block row in response to selection by the selected word line. If the memory cell into which data has been written is the first memory cell, the decode signal is changed, the above operation being repeated, thereby writing data into the first memory cell of the remaining memory cell block row.

Next, the data written into memory is read out as follows:

First, when the decode signal which selects the first memory cell of a given memory cell block column is input to the second word line selection means, the readout word line for one word line is selected. Then, data is read out from the first memory cell of each pair of the memory cells of the first memory cell block column selected by this selected word line into the corresponding data readout bit.

Then, in the same manner, by reading out data from the first memory cell of each pair of the memory cells of the remaining memory cell block columns, it is possible to perform parallel-to-serial conversion. During this readout operation, since the first word line selection means, the data input bit line and the second write word line are not used, it is possible to use these to write data into the second memory cell within the memory cell block of a row, as described above. By doing this, it is possible to perform parallel-to-serial conversion in succession without interruption, and also to achieve a reduction of the occupied space in comparison with the prior art.

Furthermore, when performing data readout, one readout operation is capable of reading out a as many bits of data at once as there are memory cell pairs in a memory cell block.

BRIEF DESCRIPTION OF THE DRAWINGS

In the attached drawings,

FIG. 1 is a circuit diagram which shows the configuration of a memory cell block of a parallel-to-serial conversion device according to the present invention.

DESCRIPTION OF A PREFERRED EMBODIMENT

Figure 2:
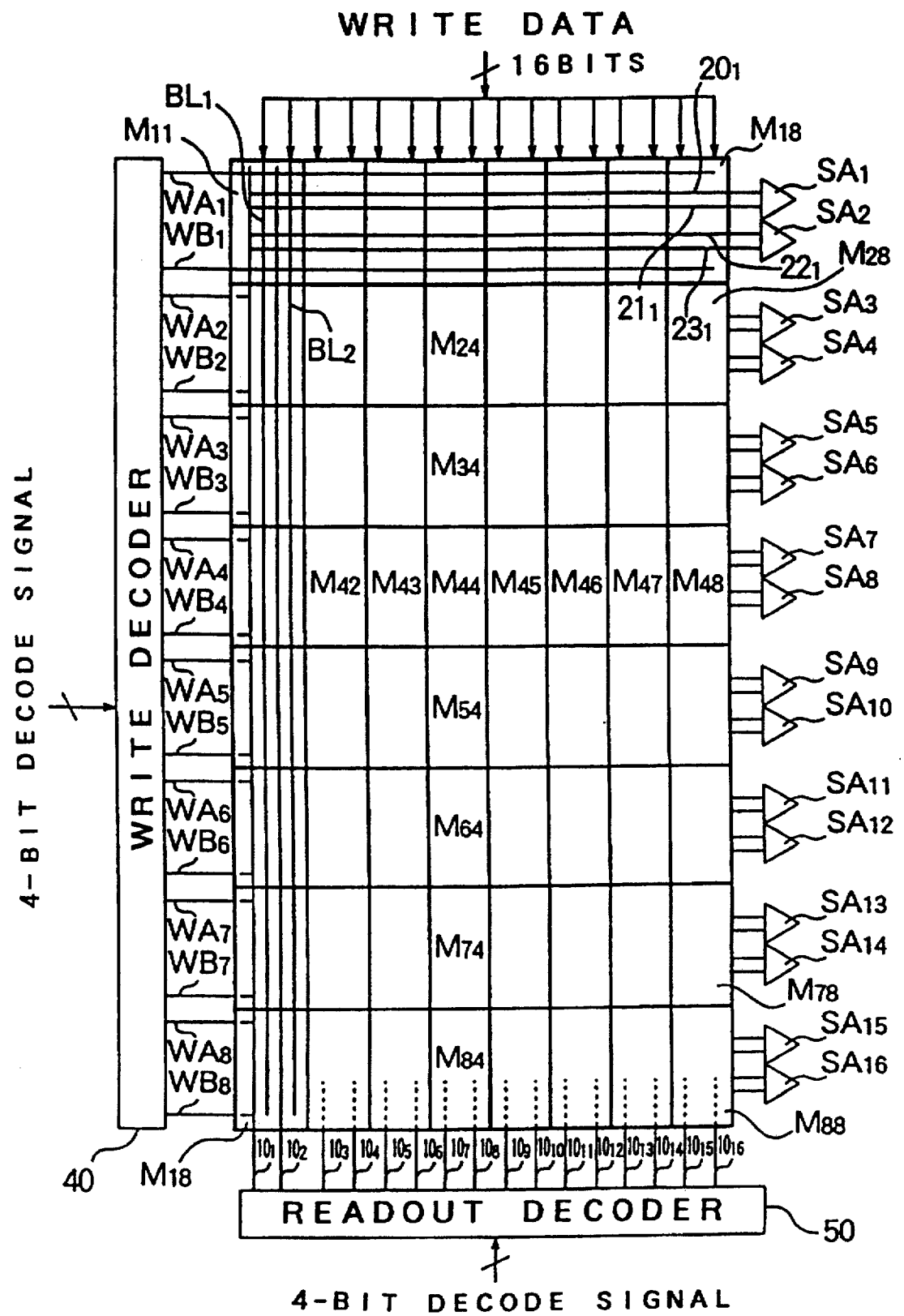
FIG. 2 is a block diagram which shows an embodiment of a parallel-to-serial conversion device according to the present invention.
Figure 3:
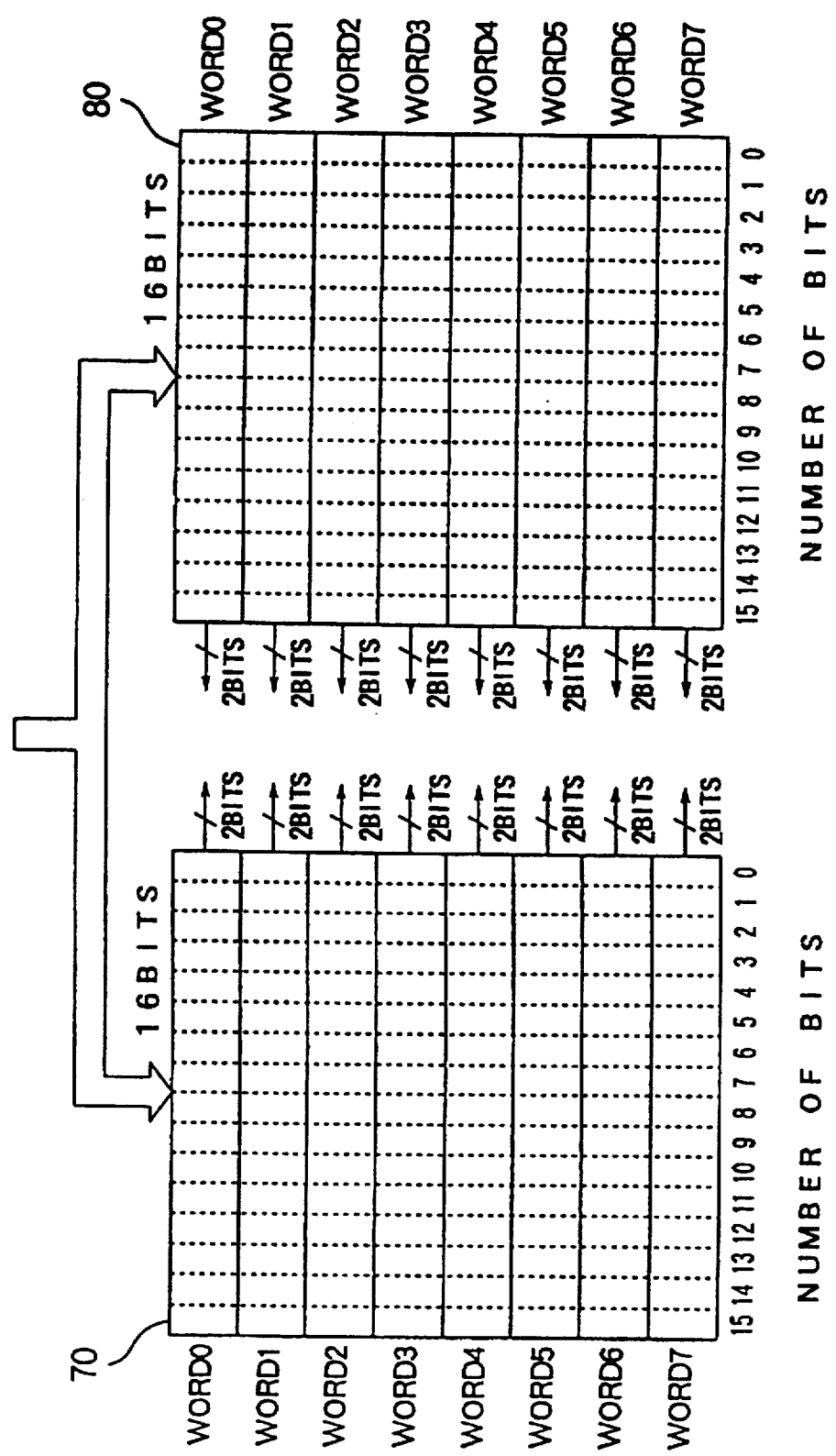
FIG. 3 is a schematic representation of a prior art parallel-to-serial conversion device.

A preferred embodiment of the present invention will be described below, with reference being made to the attached drawings FIGS. 1 and 2. FIG. 2 is a block diagram which shows the configuration of a parallel-to-serial conversion device of this embodiment, and FIG. 1 is a circuit diagram which shows the detailed configuration of memory cell block $M_{ij}$ of the parallel-to-serial conversion device shown in FIG. 2. As shown in FIG. 2, the parallel-to-serial conversion device of this embodiment has a memory section consisting of memory cell blocks $M_{ij}$ (where i, j=1, . . . , 8) arranged in a 8-row-by-8-column matrix configuration, word lines $WA_i$ and $WB_i$ (where i=1, . . . , 8) for writing data into memory cells, data input bit lines $\overline{BL_{2j-1}}$, $BL_{2j}$, $BL_{2i-1}$ and $BL_{2j}$ (where j=1, . . . , 8), word lines $10_1, \ldots, 10_{16}$ for reading out data from memory cells, bit lines $20_i$, $21_i$, $22_i$, and $23_i$ (where i=1, . . . , 8) for reading out data, writing decoder 40, reading decoder 50, and sense amplifiers $SA_1$, . . . , $SA_{16}$. As shown in FIG. 1, each memory cell block $M_{ij}$ has four memory cells 1, 2, 3, and 4. Because all the memory cells have the exact same configuration, the explanation that follows will be limited to the example of memory cell 1. Memory cell 1 has formed from n-channel MOS transistors 1a, 1b, 1e, 1f, 1g, and 1h, and a flip-flop that is formed by inverters 1c and 1d. The transistors 1a and 1b and the inverters 1c and 1d form an SRAM (static random access memory) cell. The gate of the transistor 1e is connected to one of the outputs of the above-noted SRAM cell outputs, the source is grounded, and the drain is connected to the source of transistor 1g. The gate of transistor 1f is connected to the other output of the above-noted SRAM cell, the source is grounded, and the drain is connected to the source of the transistor 1h.

The gates of transistors 1a and 1b of the memory cell 1 and gates of the corresponding transistors 2a and 2b in the memory cell 2 are commonly connected to the word line $WA_i$, and the gates of transistors 3a and 3b of the memory cell 3 and gates of the corresponding transistors 4a and 4b in the memory cell 4 are connected to the word line $WB_i$. One end of transistor 1a of memory cell 1 and one end of the corresponding transistor 3a in the memory cell 3 are connected to the data input bit line $\overline{BL_{2j-1}}$, and one end of transistor 1b of the memory cell 1 and one end of the corresponding transistor 3b in the memory cell 3 are connected to the data input bit line $BL_{2j-1}$. One end of transistor 2a of the memory cell 2 and one end of the corresponding transistor 4a in the memory cell 4 are connected to the data input bit line $BL_{2j}$, and one end of transistor 2b of memory cell 2 and one end of the corresponding transistor 4b in the memory cell 4 are connected to the data input bit line $\overline{BL_{2j}}$.

The drain of transistor 1g of memory cell 1 and the drain of the corresponding transistor 3g in memory cell 3 are connected to the data readout bit line $20_i$, and the drain of transistor 1h of memory cell 1 an the drain of the corresponding transistor 3h in the memory cell 3 are connected to the data readout bit line $21_i$. The drain of transistor 2g of the memory cell 2 and the drain of the corresponding transistor 4g in the memory cell 4 are connected to the data readout bit line $22_i$, and the drain of transistor 2h of the memory cell 2 an the drain of the corresponding transistor 4h in the memory cell 4 are connected to the data readout bit line $23_i$. The gates of transistors 1g, 1h, 2g, and 2h are connected to the word line $10_{2j-1}$, and the gates of transistors 3g, 3h, 4g, and 4h are connected to the word line $10_{2j}$.

Therefore, the two word lines $WA_i$ and $WB_i$ are assigned to the 8 memory cell blocks $M_{i1}$, $M_{i2}$, . . . , $M_{i8}$ of the i-th row, and the 4 data input bit lines $BL_{2j-1}$, $\overline{BL_{2j-1}}$, $BL_{2j}$, and $\overline{BL_{2j}}$ and 2 readout word lines $10_{2j-1}$ and $10_{2j}$ are assigned to the 8 memory cell blocks $M_{1j}$, $M_{2j}$, . . . , $M_{8j}$ of the j-th column.

The writing decoder 40 decodes the 4-bit decode signal, and either selects one word line of the 8 word lines $WA_1$, . . . , $WA_8$ or selects one word line of the 8 word lines $WB_1$, . . . , $WB_8$. Normally, the lower order 3 bits of the 4-bit decode signal select the i-th memory cell block row number (where i=1 to 8), the upper order bit (MSB) selecting either word line $WA_i$ or $WB_i$. The readout decoder 50 decodes the 4-bit decode signal, and either selects one word line $10_8$ of the 16 word lines $10_1$, . . . , $10_{16}$. Normally, the lower order 3 bits of the 4-bit decode signal select the j-th memory cell block column number (where j=1 to 8), the upper order bit (MSB) selecting either word line $10_{2j-1}$ or word line $10_{2j}$.

The readout data bit lines $20_i$ and $21_i$ (where i=1 to 8) are connected to the input terminals of the sense amplifier $SA_{2i-1}$, and the readout data bit lines $22_i$ and $23_i$ (where i=1 to 8) are connected to the input terminals of the sense amplifier $SA_{2i}$.

The operation of this embodiment is described below.

If 16 bits $D_1$, . . . , $D_{16}$ ($D_k$, where k=1 to 16, each bit being either 0 or 1) of write data representing one pixel of data is received from an external device, the k-th (k=1 to 16) data $D_k$ is input to the data input bit line $BL_k$. When doing this, $D_k$, which is the inverted data of $D_k$ is input to the corresponding bit line $\overline{BL_k}$. When the 4-bit decode signal is sent to the writing decoder 40, this decode signal is decoded by the writing decoder 40, and one word line of the 16 word lines $WA_1$, . . . , $WA_8$, and $WB_1$, . . . , $WB_8$ is selected. If the selected word line at this point happens to be $WA_1$, the gate transistors 1a, 1b, 2a, and 2b of the memory cells 1 and 2 of the first row memory cell block $M_{1j}$ (where j=1 to 8) are turned on, and data $D_{2j-1}$ and $D_{2j}$ are written into memory cells 1 and 2, respectively. Therefore, each time the data for 8 pixels is sequentially input to the data input bit lines $BL_1$, ..., $BL_{16}$, if the selection words $WA_1$, ..., $WA_8$ are sequentially selected, the data for the 8 pixels will be written into memory cells 1 and 2. For example, the data for the first 8 pixels will be written into memory cells 1 and 2 of the 1st row memory cell blocks $M_{11}, M_{12}, \ldots, M_{18}$, and the data for the i-th 8 pixels will be written into memory cells 1 and 2 of the i-th row memory cell blocks $M_{i1}, M_{i2}, \ldots, M_{i8}$.

Data written as described above into memory cells 1 and 2 of each memory cell block $M_{ij}$ is read out in the following manner. Consider the case in which the 4-bit decode signal is input to the reading decoder 50. When this happens, one selection word line of the 8 selection word lines $10_1, 10_3, \ldots, 10_{18}$ is selected. If the selected word line is, for example, word line $10_1$, the transistors 1g, 1h, 2g, and 2h of memory cells 1 and 2 of the 1st row memory cell blocks $M_{11}, M_{21}, \ldots, M_{82}$ are turned on. When this is done, the data held in memory cell 1 of the memory cell block $M_{i1}$ (i=1, ..., 8) (for example, the upper order bit) and the corresponding inverted data are is sent to the sense amplifiers $SA_{2i-1}$ connected respectively via the transistor 1g to the readout bit line $20_i$ and via transistor 1h to the readout bit line $21_i$. The data held in memory cell 2 of the memory cell block $M_{i1}$ (i=1, ..., 8) (for example, the lower order bit) and the corresponding inverted data are is sent to the sense amplifiers $SA_{2i}$ connected respectively via the transistor 2g to the readout bit line $20_i$ and via transistor 2h to the readout bit line $21_i$. That is, when the first readout operation is performed, the 2 digits of bit data corresponding to the 1st to the 8th pixels is read out. Therefore, if the value of the 3 lower order bits of the 4 bits of decode signal is changed to sequentially select the word lines $10_1, 10_3, \ldots, 10_{16}$, the 8 16-bit data will be read out from the sense amplifiers $SA_1, \ldots, SA_{16}$. Parallel-to-serial conversion is performed by writing 8 16-bit data into the memory cell blocks and reading the data from the memory cell blocks as described above.

In the parallel-to-serial conversion device of this embodiment, because the data input bit lines $BL_{2j-1}$ and $BL_{2j}$ and the word lines $WA_i$ and $WB_i$ are not used when reading data from memory cells 1 and 2 of memory cell blocks $M_{ij}$, it is possible, during data readout to write 8 16-bit data into memory cells 3 and 4 of memory cell blocks $M_{ij}$. By alternating in this manner between simultaneous data writing into memory cells 1 and 2 and data readout from corresponding memory cells 3 and 4 and simultaneous data writing into memory cells 3 and 4 and data readout from corresponding memory cells 1 and 2, it is possible to perform parallel-to-serial conversion as in the conventional art without interruption. Also, because the parallel-to-serial conversion device of this embodiment does not, in contrast to the prior art, require two corner turn memories, it provides a reduction of occupied space in comparison to the prior art.

Although in the above-noted embodiment there are two memory cell pairs provided for each memory cell block $M_{ij}$, it is possible to have n pairs of memory cells and to provide 2n data readout bit lines for a memory cell block of a given row, thereby enabling n digits of bit data to be read out with a single readout operation.

Also, if the outputs of the sense amplifiers $SA_1, \ldots, SA_{16}$ of the parallel-to-serial conversion device of the above-described embodiment are connected to the input section of a butterfly calculation element in the case of a forward discrete cosine transformation, or to the address input terminals of a ROM into which is stored the product sum results in the case of a reverse discrete cosine transformation, it is possible to use the parallel-to-serial conversion device of the above-noted embodiment as the data input device for a discrete cosine transformation device.

Also, if the output terminals of the sense amplifiers $SA_1, \ldots, SA_{16}$ of the parallel-to-serial conversion device of the above-noted embodiment are connected to the address input terminals of a ROM into which is stored the product sum results of a discrete Fourier transformation device, it is possible to use the parallel-to-serial conversion device of the above-noted embodiment as the data input device of a discrete Fourier transformation device.

If the parallel-to-serial conversion device of the above-noted embodiment is used in this manner as the data input device for a discrete cosine transformation device or a discrete Fourier transformation device, it is possible to reduce the space occupied by the discrete cosine transformation device or a discrete Fourier transformation device.

According to the present invention as described above, by combining two corner turn memories, the amount of occupied space is minimized.

What is claimed is:

1. A parallel-to-serial conversion device comprising:
   a corner turn memory array provided in an input section of the device, the corner turn memory having a plurality of memory cells arranged in matrix form, said corner turn memory performing parallel-to-serial conversion by writing in the row direction of the input section and by reading out in the column direction of the input section, said corner turn memory array including a plurality of memory cells, each memory cell being grouped in either a first memory bank or a second memory bank;

write means for selectively writing data into a first pair of memory cells of said corner turn memory array; and readout means for reading data from a second pair of memory cells which are different from the first pair of memory cells simultaneously with writing data into the first pair of memory cells.

2. A parallel-to-serial conversion device according to claim 1, wherein said first pair of memory cells is a portion of the first memory bank and said second pair of memory cells is a portion of the second memory bank, wherein the first and second memory cells are arranged alternately.

3. A parallel-to-serial conversion device comprising:
   a corner turn memory array provided in an input section of the device, having a plurality of memory banks, each memory bank including a plurality of memory cells arranged in matrix form, said corner turn memory performing parallel-to-serial conversion by writing in the row direction of the input section and by reading out in the column direction of the input section;

a circuit for selectively writing data into a first pair of memory cells of said corner turn memory array; and a circuit for reading data from a second pair of memory cells which are different from the first pair of memory cells simultaneously with writing data into the first pair of memory cells, wherein said reading circuit includes a decoder corresponding to said memory arrays, and wherein writing operations into the memory arrays and reading operations from the memory arrays are performed alternately between a first memory bank and a second memory bank.

4. A parallel-to-serial conversion device comprising:

a memory section having a plurality of memory cell blocks, each memory cell block having a predetermined number of memory cell pairs comprised of a first memory cell and a second memory cell, the memory cell pairs of each memory cell block being arranged in matrix form, each first memory cell having a first output terminal and each second memory cell having a second input terminal, wherein the first and second output terminals of a memory cell pair are coupled;

a data input bit line provided for each memory cell pair within a memory cell block column for inputting data to said memory cell pairs;

first and second writing word lines provided for each memory cell block row for selecting memory cells when writing data into the first and second memory cells of a memory cell block row;

first and second readout word lines provided for each memory cell block column for reading out data from the first and second memory cells of a memory cell block column;

a data readout bit line provided for each memory cell pair in a memory cell block row;

a first word line selection circuit for selecting one word line from said writing word lines based on a first decode signal when writing data; and a second word line selection circuit for selecting one word line from said readout word lines based on a second decode signal when reading data.

5. In a linear transformation device including a parallel-to-serial conversion device as a data input device which performs parallel-to-serial conversion, said parallel-to-serial conversion device comprising:

a memory section having a plurality of memory cell blocks having a predetermined number of memory cell pairs, the memory cell pairs of each memory cell block being arranged in matrix form, each memory cell having a first memory cell and a second memory cell, each first memory cell having a first output terminal and each second memory cell having a second input terminal, wherein the first and second output terminals of a memory cell pair are coupled;

a data input line provided for each memory cell pair within a memory cell block column for inputting data to said memory cell pairs;

first and second writing word lines provided for each memory cell block row for selecting memory cells when writing data into the first and second memory cells of a memory block row;

first and second readout word lines provided for each memory cell block column for reading out data from the first and second memory cells of a memory cell block column;

a data readout line provided for each memory cell pair in a memory cell block row;

a first word line selection circuit for selecting one word line from said plurality of writing word lines based on a first decode signal when writing data; and a second word line selection circuit for selecting one word line from said plurality of reading word lines based on a second decode signal when reading data.

6. A linear transformation device according to claim 4, wherein said linear transformation device is a discrete cosine transformation device.

7. A linear transformation device according to claim 4, wherein said linear transformation device is a discrete Fourier transformation device.

8. A method of converting a parallel data stream to a serial data stream comprising:

selectively writing parallel data in a row direction of a corner turn memory, the corner turn memory having a plurality of memory cells arranged in matrix form, said corner turn memory array including a plurality of memory cells, each memory cell being grouped in either a first memory bank or a second memory bank, the writing step including writing data into a first pair of memory cells of said corner turn memory array; and selectively reading data from a second pair of memory cells, said second pair of memory cells being different from said first pair of memory cells, in a column direction simultaneously with the step of writing data into the first pair of memory cells.

9. The method of claim 8, the method further comprising:

writing data into the first pair of memory cells of said corner turn memory array, the first pair of memory cells being a portion of the first memory bank; and reading data from the second pair of memory cells, the second pair of memory cells being a portion of the second memory bank.

10. A method of converting a parallel data stream to a serial data stream, the method comprising:

decoding a write selection signal to provide a decoded write selection signal;

selectively writing parallel data in a row direction of a corner turn memory in response to the decoded write selection signal, the turn corner memory having a plurality of memory cells arranged in matrix form, said corner turn memory including memory cells of a first memory bank and a second memory bank, the writing step including writing data into a first pair of memory cells of said corner turn memory;

decoding a read selection signal to provide a decoded read selection signal; and selectively reading data from a second pair of memory cells in response to the decoded read selection signal, said second pair of memory cells being different from said first pair of memory cells, in a column direction simultaneously with the step of writing data into the first pair of memory cells, wherein the writing step and the reading step are performed alternately between the first memory bank and the second memory bank.

11. A method of converting a parallel data stream to a serial data stream in a memory having a plurality of memory cell blocks, each memory cell block having a predetermined number of memory cell pairs, each memory cell pair including a first memory cell and a second memory cell, the memory cell pairs of each memory cell block being arranged in matrix form, the method comprising:

selecting one of the first and the second memory cells of a memory cell block row to have data written thereto in response to a first decode signal;

writing data to the selected memory cells of the memory cell block row;

selecting one of the first and the second memory cells of a memory cell block column to have data read therefrom in response to a second decode signal; and reading data from the selected memory cells of the memory cell block column.

12. A method of converting a parallel data stream to a serial data stream in a discrete cosine transformation device, the discrete cosine transformation device including a memory having a plurality of memory cell blocks, each memory cell block having a predetermined number of memory cell pairs, each memory cell pair including a first memory cell and a second memory cell, the memory cell pairs of each memory cell block being arranged in matrix form, the method comprising:

- selecting one of the first and the second memory cells of a memory cell block row to have data written thereto in response to a first decode signal;
- writing data to the selected memory cells of the memory cell block row;
- selecting one of the first and the second memory cells of a memory cell block column to have data read therefrom in response to a second decode signal; and
- reading data from the selected memory cells of the memory cell block column.

13. A method of converting a parallel data stream to a serial data stream in a discrete Fourier transformation device, the discrete Fourier transformation device including a memory having a plurality of memory cell blocks, each memory cell block having a predetermined number of memory cell pairs, each memory cell pair including a first memory cell and a second memory cell, the memory cell pairs of each memory cell block being arranged in matrix form, the method comprising:

- selecting one of the first and the second memory cells of a memory cell block row to have data written thereto in response to a first decode signal;
- writing data to the selected memory cells of the memory cell block row;
- selecting one of the first and the second memory cells of a memory cell block column to have data read therefrom in response to a second decode signal; and
- reading data from the selected memory cells of the memory cell block column.

* * * * *